US006369600B2

(12) United States Patent
Farnworth et al.

(10) Patent No.: US 6,369,600 B2
(45) Date of Patent: *Apr. 9, 2002

(54) TEST CARRIER FOR TESTING SEMICONDUCTOR COMPONENTS INCLUDING INTERCONNECT WITH SUPPORT MEMBERS FOR PREVENTING COMPONENT FLEXURE

(75) Inventors: Warren M. Farnworth, Nampa; Mike Hess, Kuna; David R. Hembree, Boise; James M. Wark, Boise; John O. Jacobson, Boise; Salman Akram, Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/110,231

(22) Filed: Jul. 6, 1998

(51) Int. Cl.[7] .................................................. G01R 31/26
(52) U.S. Cl. ........................................ 324/765; 324/755
(58) Field of Search ................................ 324/754, 755, 324/765; 438/14, 17, 18; 257/40, 48; 439/66, 74, 73, 331

(56) References Cited

U.S. PATENT DOCUMENTS

| 5,006,792 | A | * | 4/1991 | Malhi et al. ................. 324/72.5 |
| 5,172,050 | A | * | 12/1992 | Swapp ....................... 324/72.5 |
| 5,329,423 | A | * | 7/1994 | Scholz ........................ 324/755 |
| 5,483,741 | A | * | 1/1996 | Akram et al. .................. 29/846 |
| 5,519,332 | A | | 5/1996 | Wood et al. ................. 324/755 |
| 5,541,525 | A | | 7/1996 | Wood et al. ................. 324/755 |
| 5,559,444 | A | | 9/1996 | Farnworth et al. ........... 324/754 |
| 5,578,934 | A | | 11/1996 | Wood et al. ................. 324/758 |
| 5,634,267 | A | | 6/1997 | Farnworth et al. ............. 29/840 |
| 5,674,785 | A | | 10/1997 | Akram et al. ................ 437/217 |
| 5,686,317 | A | | 11/1997 | Akram et al. ................... 437/8 |
| 5,739,050 | A | | 4/1998 | Farnworth ..................... 438/15 |
| 5,739,585 | A | | 4/1998 | Akram et al. ................. 257/698 |
| 5,815,000 | A | | 9/1998 | Farnworth et al. |
| 5,825,195 | A | | 10/1998 | Hembree et al. |
| 5,834,945 | A | | 11/1998 | Akram et al. |
| 5,838,161 | A | | 11/1998 | Akram et al. |
| 5,878,485 | A | | 3/1999 | Wood et al. |
| 5,915,977 | A | | 6/1999 | Hembree |
| 5,929,647 | A | | 7/1999 | Akram et al. |
| 5,931,685 | A | | 8/1999 | Hembree et al. |
| 5,949,242 | A | | 9/1999 | Wood et al. |
| 5,952,840 | A | * | 9/1999 | Farnworth et al. ........... 324/755 |
| 5,962,921 | A | | 10/1999 | Farnworth et al. |
| 5,982,185 | A | | 11/1999 | Farnworth |
| 5,985,682 | A | * | 11/1999 | Potter .......................... 324/765 |
| 6,016,060 | A | | 1/2000 | Akram et al. |
| 6,018,249 | A | * | 1/2000 | Akram et al. ................ 324/758 |
| 6,022,750 | A | | 2/2000 | Akram et al. |
| 6,025,728 | A | | 2/2000 | Hembree et al. |
| 6,025,730 | A | | 2/2000 | Akram et al. |

(List continued on next page.)

Primary Examiner—Vinh P. Nguyen
(74) Attorney, Agent, or Firm—Stephen A. Gratton

(57) ABSTRACT

A test carrier and an interconnect for testing semiconductor components, such as bare dice and chip scale packages, are provided. The carrier includes a base on which the interconnect is mounted, and a force applying mechanism for biasing the component against the interconnect. The interconnect includes interconnect contacts configured to make temporary electrical connections with component contacts (e.g., bond pads, solder balls). The interconnect also includes support members configured to physically contact the component, to prevent flexure of the component due to pressure exerted by the force applying mechanism. The support members can be formed integrally with the interconnect using an etching process. In addition, the support members can include an elastomeric layer to provide cushioning and to accommodate Z-direction dimensional variations.

20 Claims, 7 Drawing Sheets

U.S. PATENT DOCUMENTS

| | | |
|---|---|---|
| 6,025,731 A | 2/2000 | Hembree |
| 6,028,437 A * | 2/2000 | Higgins, III ................ 324/757 |
| 6,040,239 A | 3/2000 | Akram et al. |
| 6,040,702 A | 3/2000 | Hembree et al. |
| 6,060,894 A | 5/2000 | Hembree et al. |
| 6,064,216 A | 5/2000 | Farnworth et al. |
| 6,068,669 A | 5/2000 | Farnworth et al. |
| 6,072,323 A | 6/2000 | Hembree et al. |
| 6,072,326 A | 6/2000 | Akram et al. |
| 6,091,250 A | 7/2000 | Wood et al. |
| 6,091,252 A | 7/2000 | Akram et al. |
| 6,094,058 A | 7/2000 | Hembree et al. |
| 6,107,109 A | 8/2000 | Akram et al. |
| 6,107,119 A | 8/2000 | Farnworth et al. |
| 6,114,240 A | 9/2000 | Akram et al. |
| 6,127,736 A | 10/2000 | Akram |
| 6,130,148 A | 10/2000 | Farnworth et al. |
| 6,188,232 B1 | 2/2001 | Akram et al. |
| 6,208,156 B1 | 3/2001 | Hembree |
| 6,208,157 B1 | 3/2001 | Akram et al. |
| 6,208,678 B1 | 3/2001 | Akram et al. |
| 6,215,322 B1 | 4/2001 | Farnworth et al. |
| 6,229,324 B1 | 5/2001 | Akram et al. |
| 6,278,286 B1 | 8/2001 | Farnworth et al. |

* cited by examiner

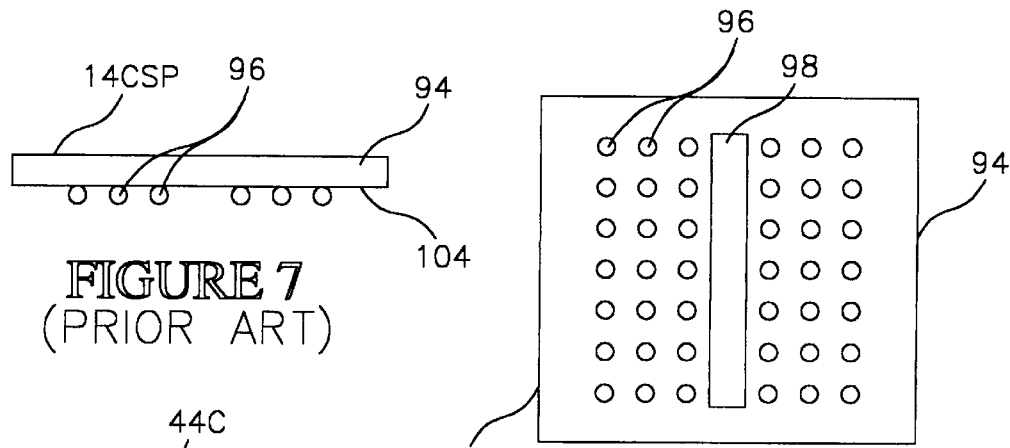
FIGURE 7 (PRIOR ART)
FIGURE 7A (PRIOR ART)
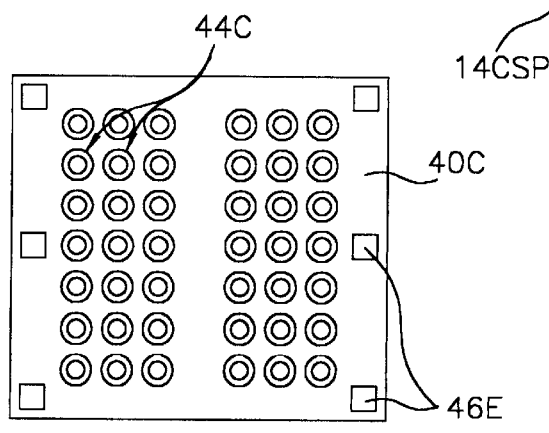
FIGURE 8
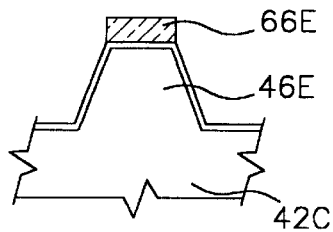
FIGURE 8A
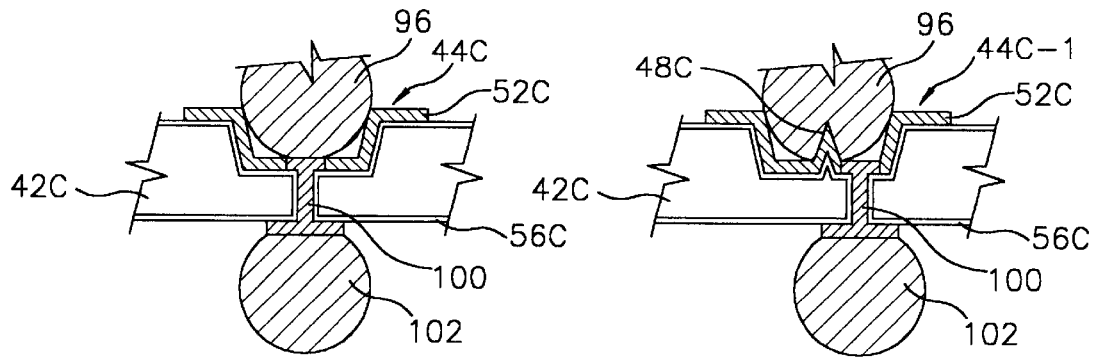
FIGURE 8B    FIGURE 8C
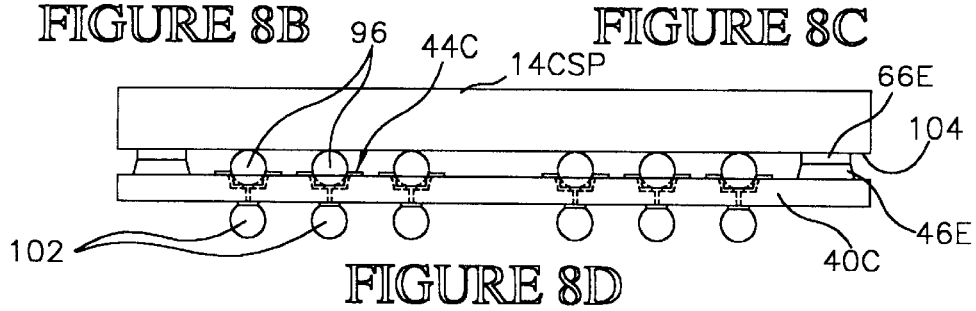
FIGURE 8D

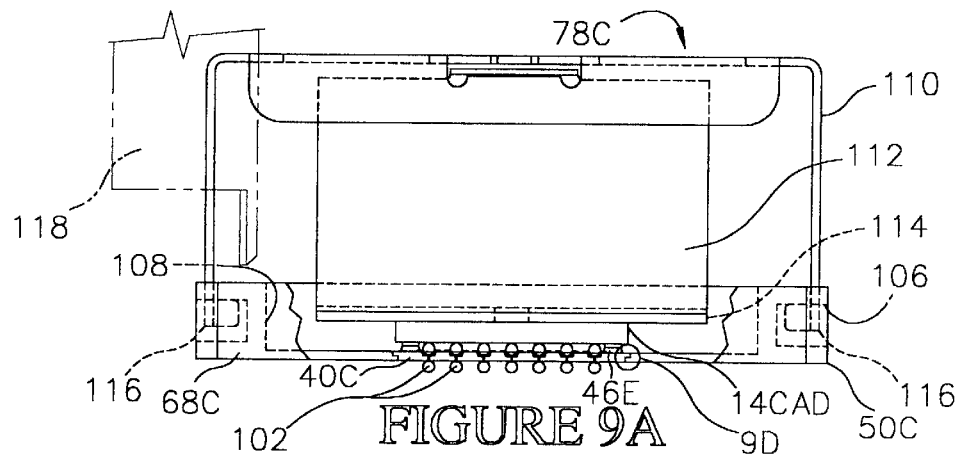
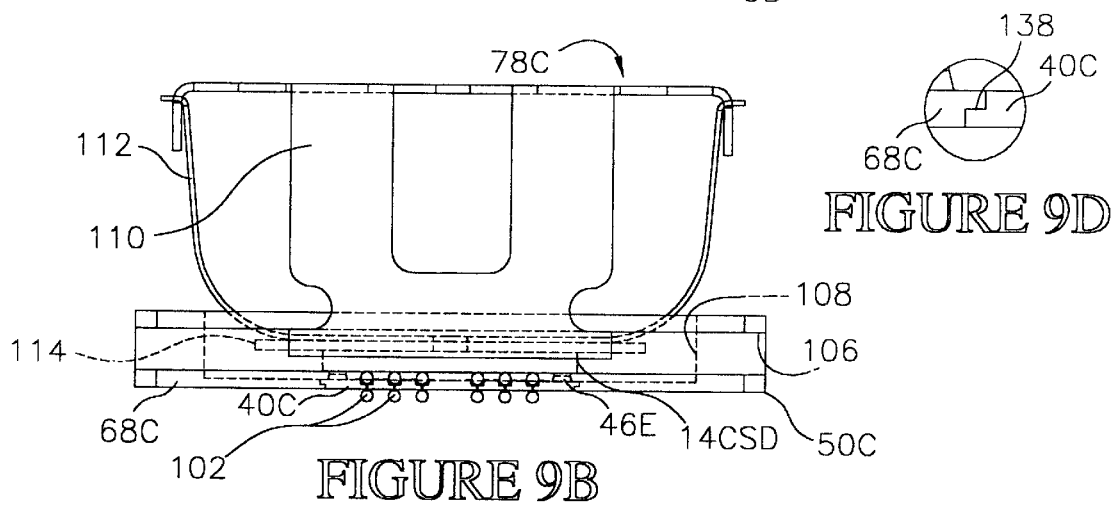
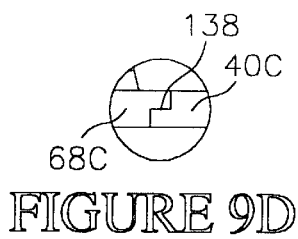
FIGURE 9D
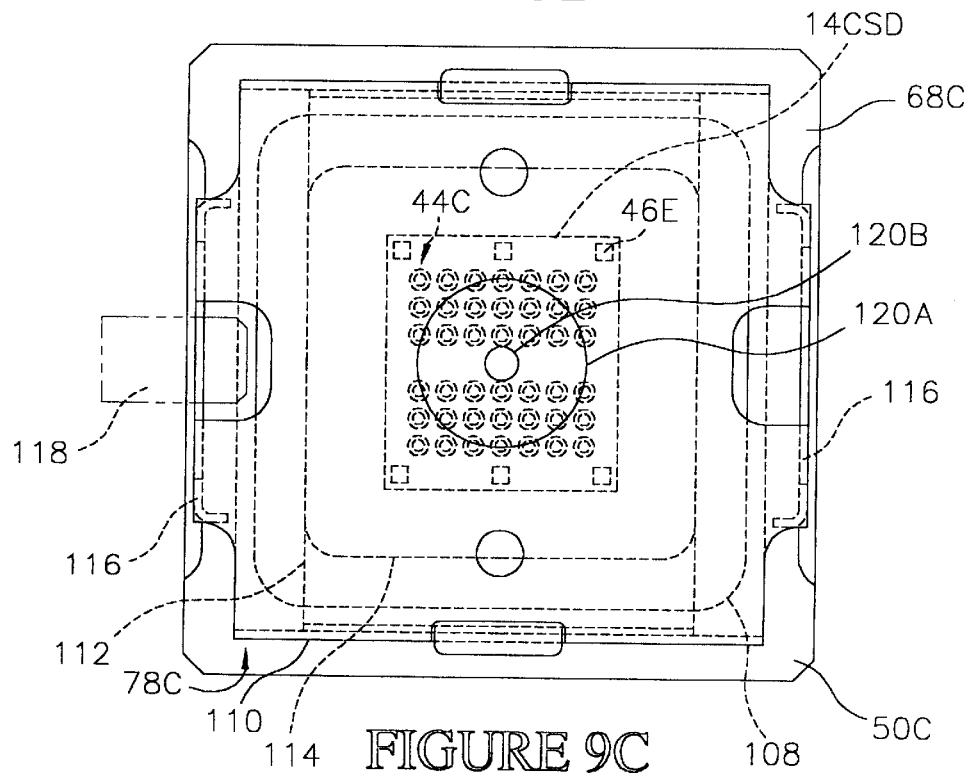

TEST CARRIER FOR TESTING SEMICONDUCTOR COMPONENTS INCLUDING INTERCONNECT WITH SUPPORT MEMBERS FOR PREVENTING COMPONENT FLEXURE

FIELD OF THE INVENTION

This invention relates generally to semiconductor manufacture, and more particularly to an improved test carrier and interconnect for temporarily packaging and testing semiconductor components, such as dice and chip scale packages. This invention also relates to a method for fabricating the carrier and the interconnect.

BACKGROUND OF THE INVENTION semiconductor components, such as bare dice and chip scale packages, must be tested prior to shipment by semiconductor manufacturers. Since these components are relatively small and fragile, carriers have been developed for temporarily packaging the components for testing. The carriers permit electrical connections to be made between external contacts on the components, and testing equipment such as burn-in boards.

An interconnect on the carrier includes contacts that make the temporary electrical connections with the external contacts on the components. On bare dice, the external contacts typically comprise planar or bumped bond pads. On chip scale packages, the external contacts typically comprise solder balls in a dense array, such as a ball grid array, or a fine ball grid array.

One problem that can occur with a temporary carrier is flexure of the component in the assembled carrier. Typically, a force applying mechanism of the carrier, such as a spring, presses the component against the interconnect. In order to insure physical and electrical contact between the external contacts on the component and the interconnect contacts, the force applying mechanism must exert a relatively large biasing force on the component. This large biasing force can sometimes cause the component to flex or bow. This flexure can cause some of the external contacts on the component to pull away from the interconnect contacts. Worse yet, the flexure can cause cracking and damage to the component.

FIGS. 1A–1C illustrates a prior art test carrier 10 constructed to temporarily package a semiconductor component 14 for testing. In this case the component 14 comprises a bare semiconductor die. The test carrier 10 is further described in U.S. Pat. No. 5,519,332 to Wood et al., entitled "Carrier For Testing An Unpackaged Semiconductor Die", which is incorporated herein by reference.

The test carrier 10 includes a base 12 and an interconnect 16 mounted to the base 12. In addition, the test carrier 10 includes a bridge clamp 18, a spring 20 and a pressure plate 22, adapted to bias the component 14 against the interconnect 16.

As shown in FIGS. 1B and 1C, the interconnect 16 includes interconnect contacts 26 adapted to electrically engage component contacts 28 (FIG. 1C) on the component 14. For example, the component contacts 28 can comprise thin film aluminum bond pads in electrical communication with integrated circuits on the component 14. The interconnect contacts 26 are in electrical communication with conductors 30 and bond pads 32 on the interconnect 16.

The interconnect 16 also includes an insulating layer 36 (FIG. 1C) for electrically insulating the interconnect contacts 26 and conductors 30. In addition, wires 24 (FIG. 1A) are bonded to the bond pads 32 on the interconnect 16, and electrically connect the interconnect contacts 26 to terminal contacts 34 (FIG. 1A) on the base 12 of the carrier 10.

The interconnect 16 is further described in U.S. Pat. No. 5,686,317 to Akram et al. entitled "Method For Forming An Interconnect Having A Penetration Limited Contact Structure For Establishing A Temporary Electrical Connection With A Semiconductor Die", which is incorporated herein by reference.

As shown in FIG. 1D, the component 14 can sometimes flex, or bow, under pressure from the spring 20 (FIG. 1A) and pressure plate 22 (FIG. 1A). This flexure can cause the component contacts 28 to pull away from the interconnect contacts 26. In addition, this flexure can cause damage to the component 14.

The present invention is directed to an improved test carrier and interconnect that are constructed to prevent flexure and bowing of a component under test.

SUMMARY OF THE INVENTION

In accordance with the present invention, an improved test carrier and interconnect are provided. The test carrier can be used to temporarily package and test a semiconductor component, without flexure of the component in the assembled carrier. The component can comprise a bare die, or a chip scale package.

The carrier includes a base for mounting the interconnect, and a force applying mechanism for biasing the component against the interconnect. The interconnect includes a substrate, and contacts formed on the substrate configured to electrically engage contacts on the component. For planar component contacts (e.g., bond pads on a bare die), the interconnect contacts can comprise raised members having penetrating projections covered with conductive layers. For bumped component contacts (e.g., solder balls on a chip scale package), the interconnect contacts can comprise indentations covered with conductive layers.

The interconnect also includes support members configured to physically contact a surface of the component, to prevent flexure of the component while biasing pressure is exerted by the force adplying mechanism. In an illustrative embodiment, the support members comprise raised pillars having a planar surface for engaging the surface of the component. In addition, the support members can include an elastomeric layer to provide cushioning, and to accommodate Z-direction dimensional variations in the component contacts. Further, the support members can be arranged to engage the component along edges thereof, in areas formed by streets, or scribe lines, of the component. In addition, the components can be provided with contact pads for physically engaging the support members on the interconnect. In an alternate embodiment, the support members are configured to physically contact a pressure plate of the force applying mechanism rather than the component.

In a first carrier embodiment the carrier base includes terminal contacts, and the interconnect is wire bonded to the base, with the interconnect contacts in electrical communication with the terminal contacts on the base. In a second carrier embodiment, the interconnect includes conductive vias and external ball contacts in electrical communication with the interconnect contacts. In the second carrier embodiment, the interconnect can be molded to the base with the external ball contacts exposed, to provide the terminal contacts for the carrier. In a third carrier embodiment the support members are formed on the carrier base rather than on the interconnect.

A method for fabricating the interconnect includes the steps of providing a substrate, and etching the substrate to form the interconnect contacts and support members. Conductive layers can then be deposited on the interconnect contacts, and if desired, an elastomeric layer can be deposited on the support members. For fabricating the interconnect with conductive vias, a laser machining process can be used to form openings in the substrate. The laser machined openings can then be filled with a conductive material, and ball contacts attached to the filled openings by soldering, brazing or welding pre-formed metal balls. Alternately a deposition process such as electroless or electrolytic plating can be used to form the ball contacts.

BRIEF DESCRIPTION OF THE DRAWINGS

FIG. 7 is a side elevation view of a prior art chip scale package;

FIG. 7A is a bottom view of the package of FIG. 7;

FIG. 8 is plan view of an alternate embodiment interconnect;

FIG. 8A is a cross sectional view taken along section line 8A—8A of FIG. 8 illustrating a support member on the interconnect;

FIG. 8B is a cross sectional view taken along section line 8B—8B of FIG. 8 illustrating a contact of the interconnect;

FIG. 8C is a cross sectional view equivalent to FIG. 8B of an alternate embodiment contact;

FIG. 8D is a side elevation view of the carrier of FIG. 8 electrically engaging the chip scale package of FIG. 7;

FIG. 9A is a side elevation view partially cut away of an alternate embodiment carrier constructed with the interconnect of FIG. 8;

FIG. 9B is an end elevation view of the carrier of FIG. 9A;

FIG. 9C is a plan view of the carrier of FIG. 9A;

FIG. 9D is an enlarged portion of FIG. 9A taken along section line 9D;

DETAILED DESCRIPTION OF THE PREFERRED EMBODIMENTS

Figure 1A:
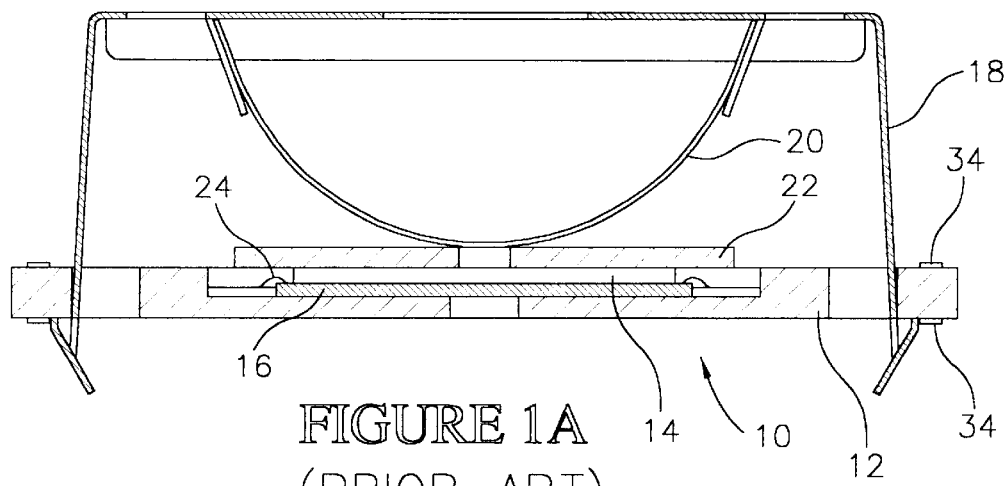
FIG. 1A is a cross sectional view of a prior art test carrier for temporarily packaging and testing a semiconductor component.
Figure 1B:
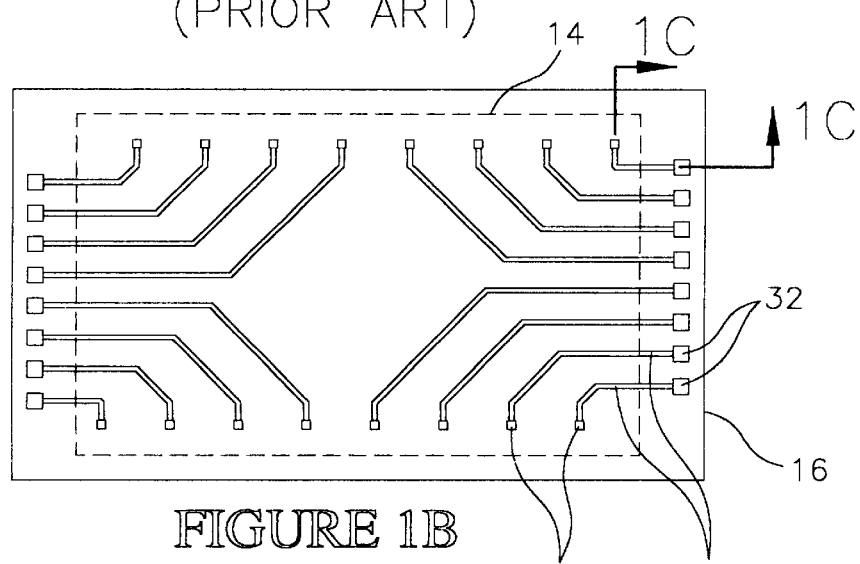
FIG. 1B is a plan view of a prior art interconnect of the test carrier with the component superimposed thereon.
Figure 1C:
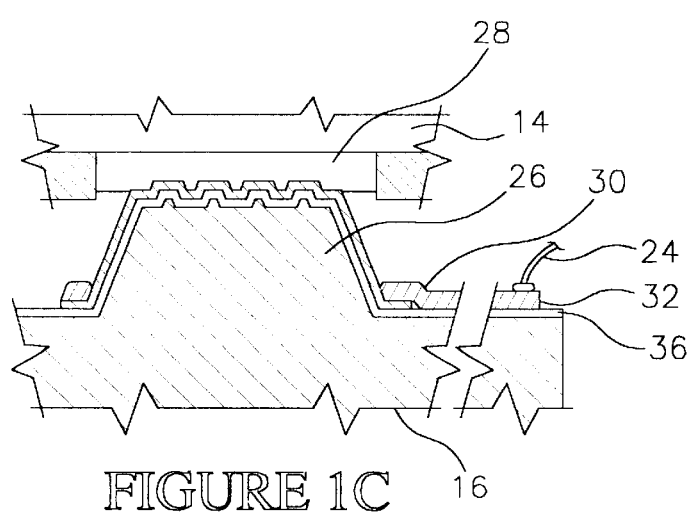
FIG. 1C is an enlarged cross sectional view taken along section line 1C—1C of FIG. 1B illustrating an interconnect contact electrically engaging a component contact.
Figure 1D:
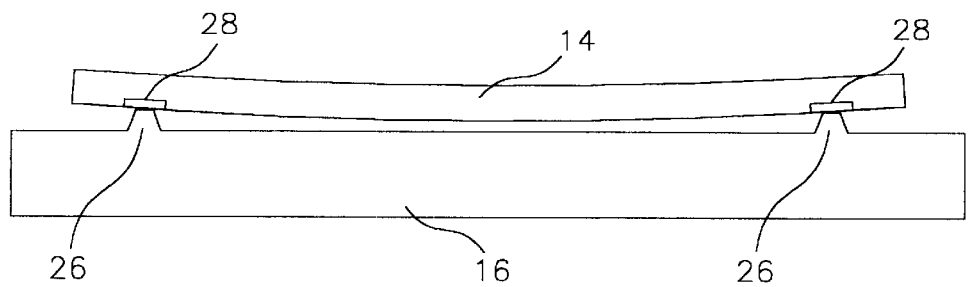
FIG. 1D is a schematic cross sectional view illustrating flexure of the component in the prior art test carrier.
Figure 2:
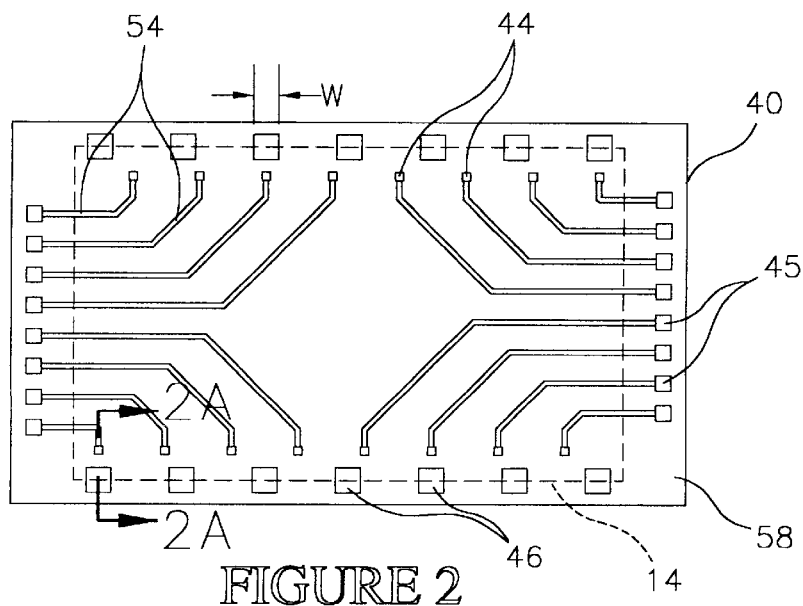
FIG. 2 is a plan view of an interconnect constructed in accordance with the invention with the component superimposed thereon.
Figure 2A:
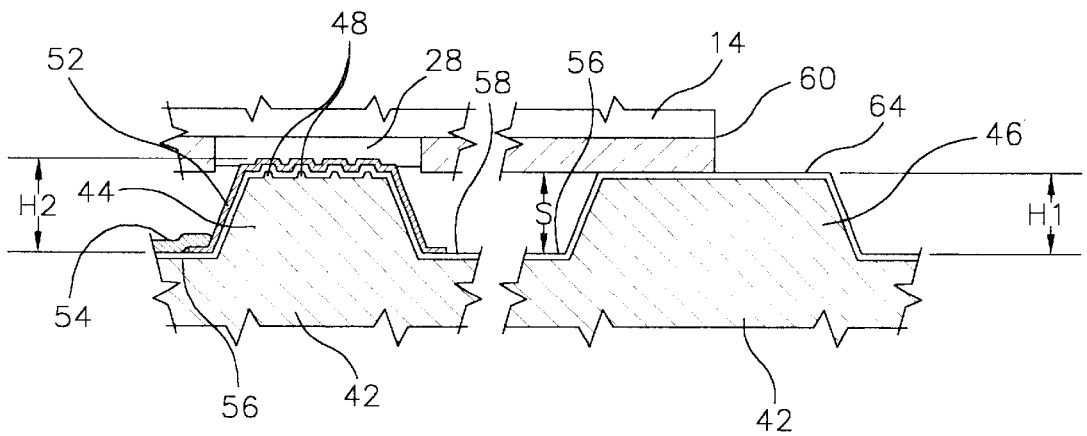
FIG. 2A is an enlarged cross sectional view taken along section line 2A—2A of FIG. 2 illustrating interconnect contacts and support members on the interconnect engaging the conponent.

Referring to FIGS. 2 and 2A, an interconnect 40 constructed in accordance with the invention is illustrated. The interconnect 40 includes a substrate 42, and a plurality of interconnect contacts 44 formed on the substrate 42. The interconnect contacts 44 are adapted to electrically engage component contacts 28 (FIG. 2A) on the component 14. In FIG. 2, the outline of the component 14 is superimposed on the interconnect 40.

The interconnect 40 also includes a plurality of support members 46. The support members 46 are adapted to physically engage the component 14 to provide support and prevent flexure of the component 14 during a test procedure. As will be further explained, the interconnect 40 will be mounted to a carrier 50 (FIG. 4) for testing the component 14.

In the illustrative embodiment the substrate 42 comprises monocrystalline silicon. However, the substrate 42 can also comprise ceramic, germanium, silicon-on-glass, or silicon-on-sapphire. The interconnect contacts 44 and support members 46 can be formed integrally with the substrate 42 using a fabrication process to be hereinafter described.

The interconnect contacts 44 are formed in a pattern that matches a pattern of the component contacts 28. In the illustrative embodiment the component contacts 28 are arranged in a pattern along opposed longitudinal edges of the component 14. In addition, as shown in FIG. 2A, the interconnect contacts 44 include penetrating projections 48 adapted to penetrate the component contacts 28 to a limited penetration depth. With the component contacts 28 comprising thin film aluminum bond pads, the penetration depth will be less than about 1 μm. The interconnect contacts 28 also include conductive layers 52 in electrical communication with conductors 54 on a surface 58 of the interconnect 40. The conductive layers 52 electrically contact the component contacts 28.

The substrate 42 includes an insulating layer 56 adapted to electrically insulate the conductive layers 52 and conductors 54 from a bulk of the substrate 42. The insulating layer 56 can also cover the support members 46. The conductors 54 include bonding pads 45 (FIG. 2) adapted to provide bonding sites for wire bonding to the carrier 50 (FIG. 4), or alternately contact sites for engagement by electrical connectors of the carrier 50.

As shown in FIGS. 2 and 2A, the support members 46 are sized and shaped to physically support edge portions 60 of the component 14. With the component 14 comprising a bare die, the edge portions 60 correspond to the streets, or scribe lines, on the wafer on which the die was fabricated. In the illustrative embodiment there are seven support members 46 on each opposed lateral edge of the component 14. However, a fewer (i.e., 1–6), or greater (i.e., more than 7), number of support members 46 can be used to support the component 14. In addition, one or more support members 46 can be sized and shaped to physically engage end edges of the component 14.

As shown in FIG. 2A, the component 14 includes a passivation layer 62, such as BPSG, formed on a surface thereof (e.g., face surface) In addition, the support members 46 include planar surfaces 64 adapted to physically touch the passivation layer 62 on the component 14. A height H1 of the support members 46 is selected such that the contacts 44 can electrically engage the component contacts 28, as the support members 46 prevent flexure and bowing of the component 14. Preferably the height H1 of the support members 46 is slightly less than a height H2 of the contacts 44. If an etch process, as hereinafter described, is used to form the support members 46 and the contacts 44, the height H1 will be less than the height H2 by a distance equal to the height of the penetrating projections 48 combined with a thickness of the conductive layer 52. The difference between H1 and H2 will be on the order of one to several microns. A representative height H1 of the support members 46 can be from 50 μm to 400 μm or greater.

A spacing S between the component 14 and the surface 58 of the interconnect 40 is approximately equal to the heights H1 and H2. The spacing S helps to clear particles and contaminants that may be present between the component 14 and surface 58 of the interconnect 40. Also, the spacing S helps to eliminate cross talk between the component 14 and interconnect 40.

In the illustrative embodiment, the support members 46 are generally pyramidally shaped pillars formed by anisotropically etching the monocrystalline silicon substrate 42. In addition, the planar surfaces 64 of the support members 46 have a generally square peripheral configuration with a width W. However, the planar surfaces 64 of the support members 46 can also comprise rectangles, circles or other polygonal shapes. Also, the support members 46 can comprise elongated ridges having a length that is greater than the width W of the support members 46. A representative value for the width W of the support members 46 can be from 50 μm to 200 μm or greater.

Figure 2B:
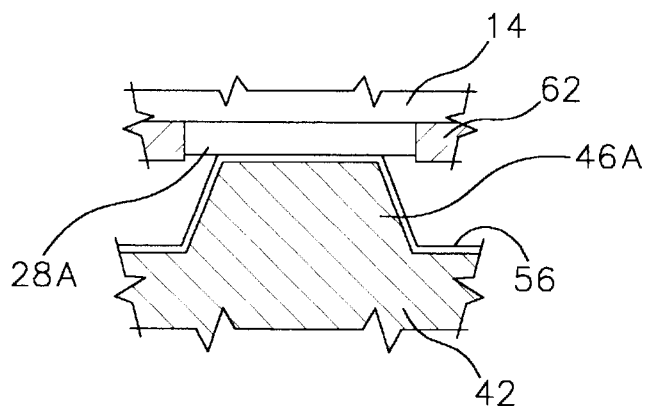
FIG. 2B is an enlarged cross sectional view equivalent to a portion of FIG. 2B illustrating an alternate embodiment support member engaging the component.

Referring to FIG. 2B, an alternate embodiment support member 46A is illustrated. In this embodiment the component 14 can be provided with one or more pads 28A. The support members 46A, rather than engaging the passivation layer 62 along the edge portion 60 of the component 14, physically engage the pads 28A on the component 14. The pads 28A can be similar in construction to thin film metal bond pads, but are not electrically connected to the integrated circuits contained on the component 14.

Figure 2C:
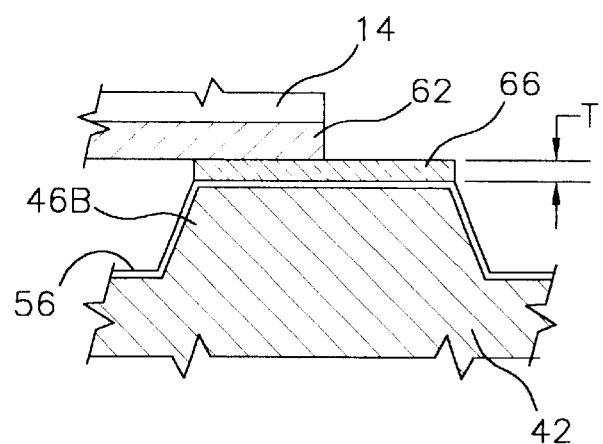
FIG. 2C is an enlarged cross sectional view equivalent to a portion of FIG. 2B illustrating an alternate embodiment support member having an elastomeric layer thereon.

Referring to FIG. 2C, alternate embodiment support members 46B include an elastomeric layer 66. The elastomeric layer 66 is adapted to provide a compliant surface for physically engaging the passivation layer 62 on the component 14. The elastomeric layer 66 can also move in the Z direction while maintaining support and preventing flexure of the component 14. This Z-direction movement can accommodate dimensional variations in the component contacts 28 or the support members 46B. The elastomeric layer 66 can comprise a deposited elastomer such as polyimide or silicone. A representative thickness T of the elastomeric layer 66 can be from 1 μm to several μm or more.

Figure 3:
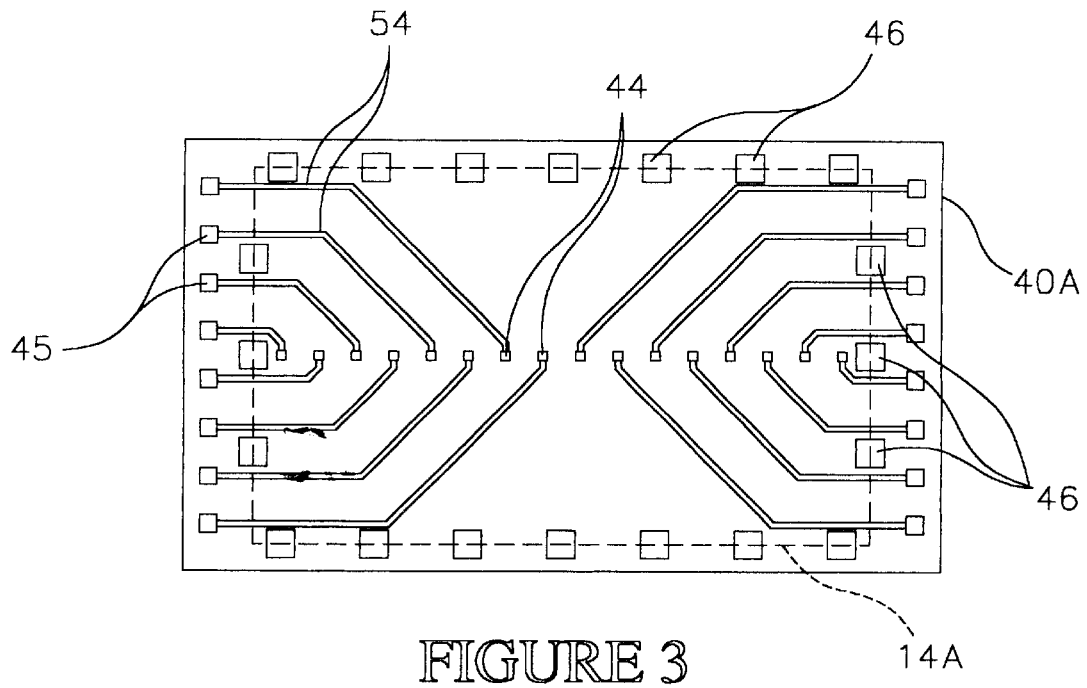
FIG. 3 is a plan view of an alternate embodiment interconnect constructed in accordance with the invention.

Referring to FIG. 3, an alternate embodiment interconnect 40A is illustrated. In this embodiment the interconnect contacts 44 are formed along a center line of the interconnect 40A to accommodate testing of a component 14A. For example, the component 14A can comprise a leads-over-chip die having component contacts (not shown) formed along a center portion of the die. Alternately an interconnect (not shown) can be configured with interconnect contacts 44 for an end connect die having component contacts (e.g., bond pads) formed along opposed ends.

Figure 4:
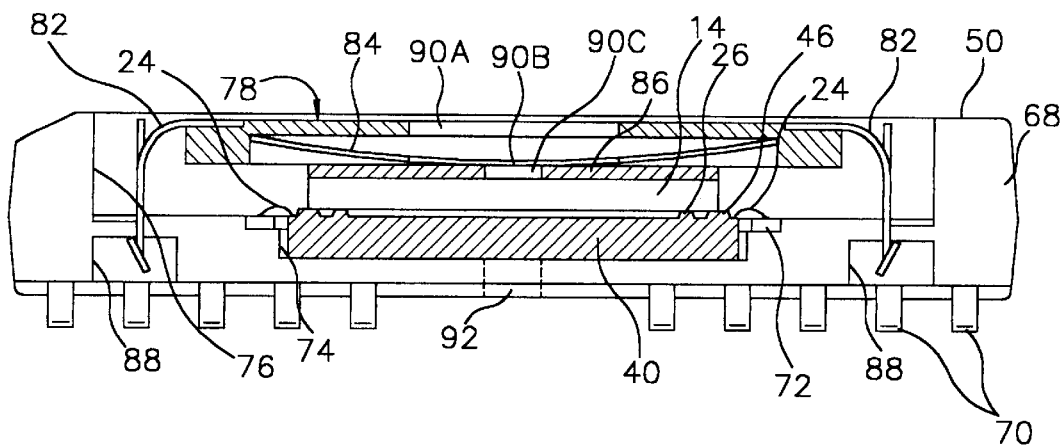
FIG. 4 is a cross sectional view of a carrier constructed with the interconnect of FIG. 2.

Referring to FIG. 4, the test carrier 50 is illustrated. The test carrier 50 includes a base 68 having a plurality of terminal leads 70 and a plurality of internal conductors 72 in electrical communication with the terminal leads 70. The base 68 includes a first recess 74 wherein the interconnect 40 is mounted. The interconnect 40 can be adhesively bonded to a surface of the base 68. Wires 24 can be wire bonded to the bond pads 45 (FIG. 2) on the interconnect 40 and to the internal conductors 72 on the base 68.

In addition, the base 68 includes a second recess 76 wherein a force applying mechanism 78 is mounted. The force applying mechanism 78 is adapted to bias the component 14 against the interconnect 40. The force applying mechanism 78 includes a lid 80, a pair of clips 82, a spring 84 and a pressure plate 86. The clips 82 removably attach to openings 88 in the base 68. In addition, openings 90A, 90B, 90C are formed in the lid 80, spring 84 and pressure plate 86 to allow access for a vacuum tool for holding the component 14 during assembly of the carrier 50. Also an opening 92 can be provided in the base 68 to facilitate removal of the interconnect 40.

The base 68 can comprise plastic molded in a desired shape using an injection molding process. Previously incorporated U.S. Pat. No. 5,519,332 discloses a method for fabricating the base 68 using a process that combines electroless and electrolytic metal plating, photolithographic patterning and wet chemical etching. This fabrication technique for electronic components is sometimes referred to as 3-D fabrication because the molded components can include metal filled vias for interconnecting the circuitry. This permits the internal conductors 72 and terminal leads 70 to be molded integrally with the base 68. Suitable plastics for the base 68 include epoxy novolac resin, silicone, phenylsilane and thermoset plastics. Other suitable plastics for the base 68 include polyetherimide (PRI), polyethersulfone (PES), polyarylsalfone (PAS), polyphenylene sulfide (PPS), liquid crystal polymer (LCP) and polyether ether ketone (PEEK).

Preferably the carrier 50 has an outline and external lead configuration equivalent to a conventional semiconductor package. The permits standard burn-in boards and test equipment to be used with the carrier 50. In the illustrative embodiment the carrier 50 is in the configuration of a small outline j-bend package (SOJ). Other suitable package configurations include ball grid array (BGA), pin grid array (PGA), land grid array (LGA), zig zag in line (ZIP), dual in line (DIP), and leadless chip carrier (LCC).

Assembly of the carrier 50 with the component 14 therein can be accomplished by optically, or mechanically aligning the component 14 with the interconnect 16, and then placing the component 14 and interconnect 16 in contact as the force applying mechanism 78 is attached to the base 68. U.S. Pat. No. 5,634,267 to Farnworth et al. entitled "Method And Apparatus For Manufacturing Known Good Semiconductor Die", which is incorporated herein by reference, describes an assembly method and automated assembly apparatus. U.S. Pat. No. 5,739,050 to Farnworth et al. entitled "Method And Apparatus For Assembling A Semiconductor Package For Testing", which is incorporated herein by reference, discloses another method for assembling the carrier 50.

As shown in FIG. 4, in the assembled carrier 50 the interconnect contacts 26 establish electrical communication between the component 40 and the terminal leads 70 on the base 68. This allows test signals to be transmitted through the terminal leads 70, the internal conductors 72, the wires 45, the conductors 54 (FIG. 2), and the interconnect contacts 26 to the integrated circuits contained on the component 14. Also in the assembled carrier 50, the support members 46 support the component 14 and prevent flexure and bowing of the component 14. The interconnect 40 can also include support members 46B (FIG. 2C) having elastomeric layer 66. Still further, the interconnect 40 can include support members 46A (FIG. 2B) for contacting pads 28A (FIG. 2B) on the component 14.

Figure 5:
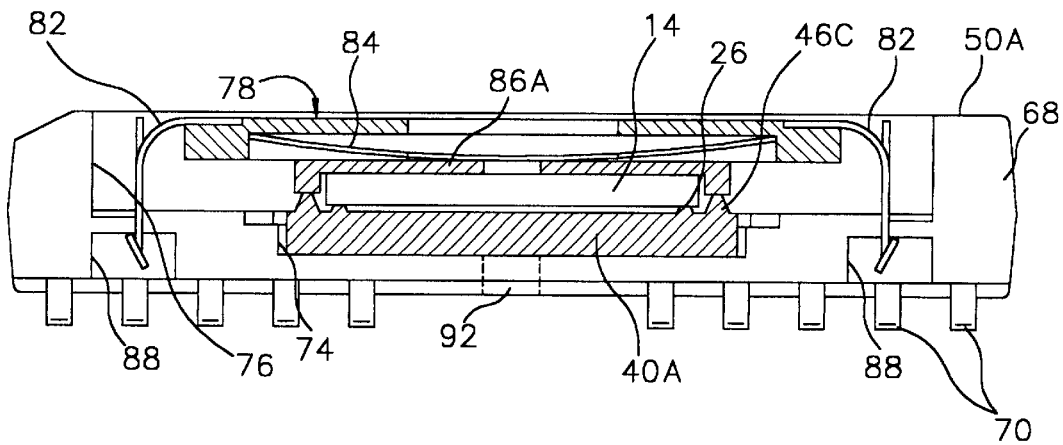
FIG. 5 is a cross sectional view of an alternate embodiment carrier constructed with an alternate embodiment interconnect.

Referring to FIG. 5, an alternate embodiment carrier 50A and interconnect 40A are illustrated. The alternate embodiment carrier 50A includes essentially the same components as previously described carrier 50 (FIG. 4). However, in this embodiment the pressure plate 86A is sized and shaped to engage support members 46C formed on the interconnect 40A. The support members 46C thus prevent flexure and bowing of the pressure plate 86A and component 14. In this embodiment the support members 46C can be substantially the same as support members 46 (FIG. 4), but in general can be larger and taller than the support members 46. The support members 46C can also include elastomeric layers as previously described for support members 46B (FIG. 2C).

Figure 6:
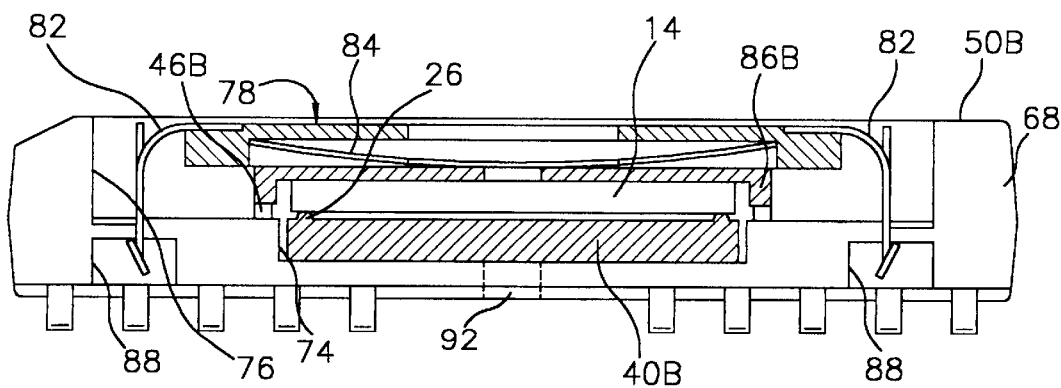
FIG. 6 is a cross sectional view of an alternate embodiment carrier.

Referring to FIG. 6, an alternate embodiment carrier 46B includes support members 50B formed directly on the base 68 of the carrier 50B. Again, the support members 50B are adapted to physically contact pressure plate 86B of the force applying mechanism 78. In this embodiment the support members 50B can comprise molded pillars formed integrally with the base 68. Alternately, the support member 50B can comprise a single ring shaped member formed of an elastomeric material such as silicone. With a ring shape member the component 14 and interconnect 40B are in effect sealed from contaminants during the test procedure.

Referring to FIGS. 7 and 7A, a prior art component 14CSP in the form of a chip scale package is illustrated. The component 14CSP is constructed as described in U.S. Pat. No. 5,674,785 to Akram et al. entitled "Method Of Producing A Single Piece Package For Semiconductor Die", and in U.S. Pat. No. 5,739,585, entitled "Single Piece Package For Semiconductor Die", both of which are incorporated herein by reference.

The component 14CSP includes a body 94 and a plurality of external ball contacts 96. The ball contacts 96 can comprise metal (e.g., solder) or conductive polymer balls formed on the body 94 in a ball grid array (BGA). The component 14CSP also includes an elongated opening 98 that allows access during fabrication of the package 14CSP to a semiconductor die (not shown) contained within the package 14CSP. As is apparent, the component 14CSP is merely illustrative of chip scale packages. Alternately, other types of components having ball contacts in a dense array can be tested using the interconnect 40C (FIG. 8) and carrier 50C (FIG. 9) to be hereinafter described.

Referring to FIGS. 8–8D, interconnect 40C which is adapted to electrically engage component 14CSP is illustrated. The interconnect 40C comprises a substrate 42C, a plurality of interconnect contacts 44C formed on the substrate 42C, and a plurality of support members 46E formed on the substrate 42C.

As shown in FIG. 8A, the support members 46E can include an elastomeric layer 46E. In addition, the support members 46E can be sized and shaped substantially as previously described for support members 46 (FIG. 2A). A method for fabricating the support members 46E using an etching process will-be-hereinafter described.

As shown in FIG. 8B, the interconnect contacts 44C are adapted to electrically engage the ball contacts 96 on the component 14CSP. Each interconnect contact 44C comprises an indentation etched or machined in the substrate 42C and covered with a conductive layer 52C. The indentations and conductive layer 52C are sized and shaped to electrically engage the contact ball 96. Also, as shown in FIG. 8C, an interconnect contact 44C-1 can include penetrating projections 48C adapted to penetrate the ball contacts 96.

Further details of the interconnect contacts 44C and 44C-1, including methods of fabrication are disclosed in U.S. patent application Ser. No. 08/829,193 now U.S. Pat. No. 5,962,921, filed Mar. 31, 1997 entitled "Interconnect Having Recessed Contact Members For Testing Semiconductor Dice And Packages With Contact Bumps", which is incorporated herein by reference.

As also shown in FIG. 8B, the interconnect contacts 44C are in electrical communication with conductive vias 100 and external ball contacts 102 formed in a ball grid array (BGA). Insulating layers 56C electrically insulate the interconnect contacts 44C and conductive vias 100 from the bulk of the substrate 42C.

The conductive vias 100 can be fabricated by etching or machining openings in the substrate 42C, insulating the openings, and then filling the openings with a metal or conductive polymer material. A method for fabricating the conductive vias 100 is described in U.S. patent application Ser. No. 08/993,965, now U.S. Pat. No. 6,107,109, filed Dec. 18, 1997, entitled "Semiconductor Interconnect Having Laser Machined Contacts", which is incorporated herein by reference.

The external ball contacts 102 can be pre-formed metal balls that are attached to a pad portion of the conductive vias by soldering, welding or brazing. Alternately a ball bonding apparatus can be used to attach pre-formed metal balls to form the external ball contacts 102. Preferably the external ball contacts 102 comprise a hard metal able to resist wear and deformation. Suitable hard metals include nickel, copper, beryllium copper, alloys of nickel, alloys of copper, alloys of beryllium copper, nickel-cobalt-iron alloys, and iron-nickel alloys.

As shown in FIG. 8D, the component 14CSP can be placed on the interconnect 40C with the ball contacts 96 on the component 14CSP electrically engaging the interconnect contacts 44C. In addition, the support members 46E and elastomeric layers 66E physically contact a surface 104 of the component 14CSP, to support and prevent flexure of the component 14CSP during a test procedure, substantially as previously described.

Referring to FIGS. 9A–9C a carrier 50C constructed with the interconnect 40C is illustrated. The carrier 50C, broadly stated, includes: a base 68C, the interconnect 40C and a force applying mechanism 78C.

The base 68C comprises a generally rectangular-shaped, member formed of molded plastic, or ceramic. The base 68C includes parallel spaced latching grooves 106 formed on either side thereof, for removably attaching the force applying mechanism 78C to the base 68C. In addition, the base 68C includes a recess 108 wherein the component 14CSP can be placed in electrical communication with the interconnect 40C.

Preferably the interconnect 40C is molded or laminated to the base 68C with the ball contacts 102 exposed to form the external contacts of the carrier 50C. In addition, the interconnect 40C preferably comprises ceramic to provide more strength. With the base 68C comprising molded plastic an injection molding process can be used to mold the interconnect 40C to the base 68C. With the base 68C comprising ceramic, a lamination process can be used to laminate the interconnect 40C to the base 68C. As shown in FIG. 9D, the interconnect 40C and base 68C can include mating stepped surfaces 138 to resist forces exerted on the interconnect 40C by the spring 112. The stepped surfaces 138 on the interconnect 40C can be made using a lamination process.

The force applying mechanism 78C includes a bridge clamp 110, a spring 112 and a pressure plate 114. The bridge clamp 110 includes latch portions 116 adapted to releasably engage the latching grooves 106 on the base 68C. An assembly tool 118, shown in phantom lines in FIG. 9A, can be used to manipulate the bridge clamp 110, and latch portions 116 thereon to attach the force applying mechanism 78C to the base 68C. In addition, the bridge clamp 110 includes an opening 120A (FIG. 9C) which allows access for a vacuum tool (not shown) for holding and manipulating the component 14CSP during assembly of the carrier 50C. The spring 112 also includes an opening (not shown), and the pressure plate 114 includes an opening 120B (FIG. 9C) for the vacuum tool (not shown). Previously cited U.S. Pat. No. 5,634,267 describes an automated assembly apparatus for assembling the carrier 50C with the component 14CSP therein.

In the assembled carrier 50C the component 14CSP is biased against the interconnect 40C by the pressure plate 114 and spring 112. With the component 14 SP biased against the interconnect 40C, the ball contacts 96 on the component 14CSP electrically engage the interconnect contacts 44C substantially as shown in FIG. 8D. In addition, the support members 46E the interconnect 40C physically contact and support the component 14CSP and prevent flexure and bending thereof. Still further, the elastomeric layer 66E (FIG. 8D) cushions the component 14CSP and compensates for Z-direction dimensional variations in the ball contacts 96 on the component 14CSP.

Referring to FIGS. 10A–10H steps in a method for fabricating the interconnect 40 (FIG. 2) are illustrated. Initially, the substrate 42 can be provided. In the illustrative embodiment the substrate 42 comprises monocrystalline silicon. However, the substrate 42 can also comprise ceramic, germanium, silicon-on-glass, or silicon-on-shapphire. A representative thickness for the substrate 42 can be from 12 mils to 200 mils or greater. The peripheral outline of the substrate 42 can correspond to the peripheral outline of the component 14 (e.g., square rectangular). A representative dimension for each side of the substrate 42 can be from 15 mm to 50 mm or greater.

Figure 10A:
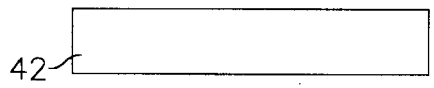
FIGS. 10A–10H are schematic cross sectional views illustrating process steps in a method for fabricating the interconnect of FIG. 2.
Figure 10B:

Next, as shown in FIG. 10B, a first mask 122 can be formed on the substrate 42 and used to etch the penetrating projections 48. The first mask 122 can comprise resist, or a hard mask such as $Si_3N_4$. In addition, a wet etchant, such as KOH, can be used to etch the substrate 42 to form the penetrating projections 48. A representative height of the penetrating protections can be from 0.25 μm to 1.0 μm.

Figure 10C:
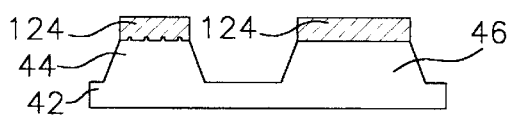

Next, as shown in FIG. 10C, a second mask 124 can be formed on the substrate 42 and used to etch the interconnect contacts 44 and the support members 46. The second mask 124 can comprise a hard mask or a resist mask. In addition, a wet etchant such a KOH can be employed to anisotropically etch the substrate 42 to form the contacts 44 and support members 46. The size and shape of the contacts 44 and support members 46 can be as previously described.

Figure 10D:
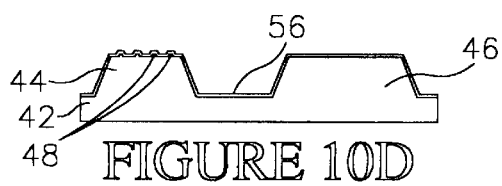

Next, as shown in FIG. 10D, the insulating layers 56 can be formed. The insulating layers 56 can comprise an electrically insulating material, such as $SiO_2$, or $Si_3N_4$, deposited to a desired thickness using CVD, or other deposition process. A $SiO_2$ layer can also be grown on exposed surfaces of the substrate 42 using an oxidizing atmosphere such as steam and $O_2$ at an elevated temperature (e.g., 950° C.). The insulating layers 56 can also comprise a polymer, such as polyimide, deposited and planarized using a suitable process (e.g., spin-on-process). Depending on the material, a representative thickness of the insulating layers 56 can be from about a 100 Å to several mils.

Figure 10E:
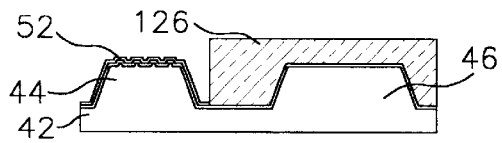

Next, as shown in FIG. 10E, a third mask 126 is formed on the substrate 42 and the conductive layers 52 are deposited on the contacts 44. The conductive layers 52 can comprise a thin film metal deposited to a thickness of several hundred A or more using a process such as CVD. The conductors 54 (FIG. 2) and bond pads 45 (FIG. 2) can be formed at the same time as the conductive layers 52 or can be formed using a separate metallization process.

The conductive layers 52 and conductors 54 can comprise a patterned layer of a highly conductive metal such as aluminum, chromium, titanium, nickel, iridium, copper, gold, tungsten, silver, platinum, palladium, tantalum, molybdenum or alloys of these metals. Rather than being a single layer of metal, the conductive layers 52 and conductors 54 can comprise multi-layered stacks of metals (e.g., bonding layer/barrier layer). The bond pads 45 can be formed using a same process as the conductors 54, or can be formed separately. However, the bond pads 45 must be formed of a wire bondable metal such as aluminum or copper.

The third mask 126 can comprise a thick film resist adapted to cover the support members 46. One suitable thick film resist is sold by Shell Chemical under the trademark "EPON RESIN SU-8". The resist also includes an organic solvent (e.g., gamma-butyloracton), and a photoinitiator. A conventional resist coating apparatus, such as a spin coater, or a meniscus coater, along with a mask or stencil, can be used to deposit the resist in viscous form onto the interconnect 18. The deposited resist can then be hardened by heating to about 95° C. for about 15 minutes or longer.

Following formation of the conductive layers 52, the third mask 126 can be stripped. A suitable wet etchant for stripping the previously described resist formulation is a solution of PGMEA (propyleneglycol-monomethyletheracetate).

Figure 10F:
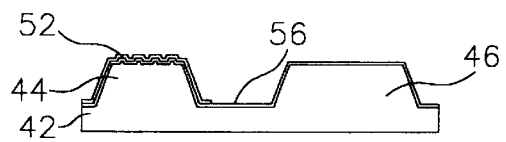

FIG. 10F shows the completed interconnect contacts 44 and support members 46.

Figure 10G:
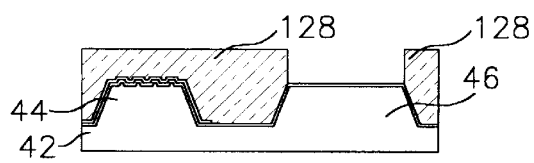
Figure 10H:
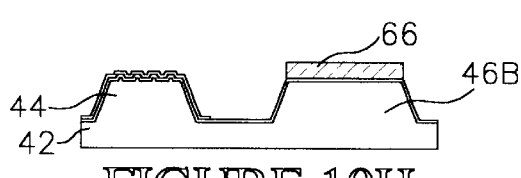

As optional additional steps, which are shown in FIGS. 10G and 10H, a fourth mask 128 (FIG. 10G) can be formed and used to deposit the elastomeric layer 66 (FIG. 10H) to form support members 46B. The elastomeric layer 66 can comprise a deposited polymer, such as polyimide, deposited to a thickness of up to several microns or more.

Figure 11A:
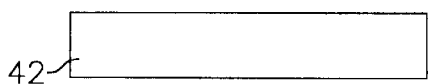
FIGS. 11A–11H are schematic cross sectional views illustrating process steps in a method for fabricating the interconnect of FIG. 8.

Referring to FIGS. 11A–11H, steps in a method for fabricating the interconnect 40C (FIG. 8) are illustrated. Initially, as shown in FIG. 11A, the substrate 42C can be provided as previously described. In the illustrative embodiment the substrate comprises silicon. However, the substrate 42C can also comprise ceramic, germanium, silicon-on-glass, or silicon-on-sapphire.

Figure 11B:
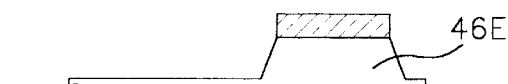
Figure 11C:
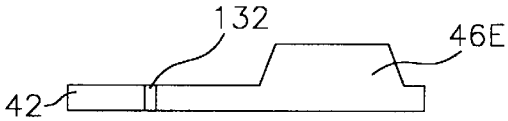

Next, as shown in FIG. 11B, a first mask 130 can be formed and the support member 46E etched as previously Next, as shown in FIG. 11C, openings 132 can be formed in the substrate 42C for the conductive vias 100. One method for forming the openings 132 is with a laser machining process. A suitable laser machining apparatus is manufactured by General Scanning of Sommerville, Mass. and is designated a model no. 670-W. A representative diameter of the openings 132 can be from 10 μm to 2 mils or greater. A representative laser fluence for forming the openings 132 through a substrate 42C comprising silicon and having a thickness of about 28 mils is from 2 to 10 watts/per opening at a pulse duration of 20–25 ns and at a repetition rate of up to several thousand per second. The wavelength of the laser beam can be a standard infrared or green wavelength (e.g., 1064 nm–532 nm).

Figure 11D:
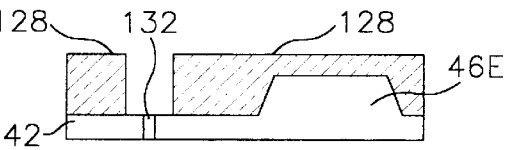
Figure 11E:
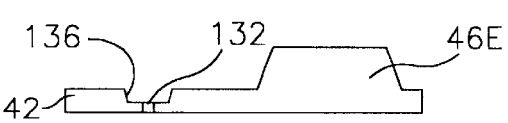

Next, as shown in FIGS. 11D and 11E, a second mask 134 can be formed as previously described, and used to etch indentations 136 for the contacts 44C. The indentations 136 can have a diameter that corresponds to that of the ball contacts 96 (FIG. 7) of the component 14CSP. A representative diameter for the indentations 136 can be from 2 mils to 50 mils or greater. At the same time that the indentations 136 are etched the openings 132 can also be etched. This etch step can be performed using potassium hydroxide (KOH), or alternately a solution of tetra-methyl ammonium hydroxide (TMAH).

Figure 11F:
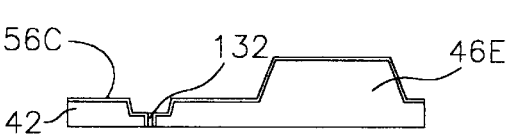

Next, as shown in FIG. 11F, the insulating layer 56C can be formed using a deposition or growth process as previously described. The insulating layer 56C can also be formed on the sidewalls of the openings 132.

Figure 11G:
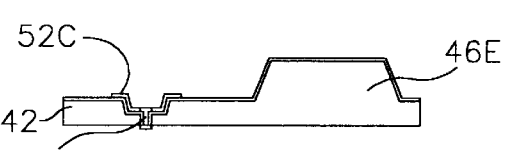

Next, as shown in FIG. 11G, the conductive layers 52C can be formed in the indentations substantially as previously described for conductive layers 52 (FIG. 10E). In addition, the openings 132 can be filled with a conductive material to form the conductive vias 100 in electrical communication with the conductive layers 52C. This step is preferably performed prior to formation of the conductive layers 52.

The conductive material for the conductive vias 100 can comprise a metal, such as solder, aluminum, titanium, nickel, iridium, copper, gold, tungsten, silver, platinum, palladium, tantalum, molybdenum or alloys of these metals. The metal can be deposited within the etched laser openings 132 using a deposition process, such as CVD, electrolytic deposition or electroless deposition. A solder metal can be screen printed in the etched laser openings 132, as well as with capillary action, or with a vacuum system using a hot solder wave.

Rather than being a metal, the conductive material can comprise a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the etched laser openings 132, as a viscous material, and then cured as required. A suitable deposition process, such as screen printing, or stenciling, can be used to deposit the conductive polymer into the etched laser openings 132.

Figure 11H:
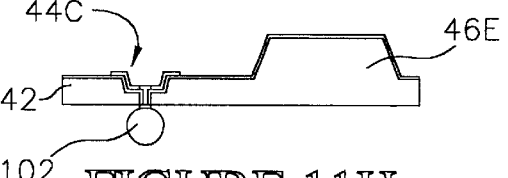

Next, as shown in FIG. 11H, the ball contacts 102 can be formed in electrical communication with the conductive vias 100. One method for fabricating the ball contacts 102 is by bonding pre-fabricated metal balls to the conductive vias 100. For example, pre-fabricated metal balls are manufactured by Mitsui Comtek Corp. of Saratoga, Calif. under the trademark "SENJU SPARKLE BALLS". The metal balls can be attached to the conductive vias 100 by soldering, laser reflow, brazing, welding, or applying a conductive adhesive.

A solder ball bumper can also be used to attach the ball contacts 102. A suitable solder ball bumper is manufactured by Pac Tech Packaging Technologies of Falkensee, Germany. The ball contacts 102 can also be attached using a conventional wire bonder apparatus adapted to form a ball bond, and then to sever the attached wire. The ball contacts 102 can also be formed by electrolytic deposition or electroless deposition of a metal to form bumps. A representative diameter for the ball contacts 102 can be from about 4 mils to 50 mils or more. A pitch of the ball contacts 102 can be from about 6 mils to 50 mils or more.

Thus the invention provides an improved interconnect and carrier for testing semiconductor components. Although the invention has been described with reference to certain preferred embodiments, as will be apparent to those skilled in the art, certain changes and modifications can be made without departing from the scope of the invention, as defined by the following claims.

We claim:

1. A test carrier for testing a semiconductor component having a surface and a plurality of component contacts on the surface comprising:
    a base;
    an interconnect on the base comprising a plurality of interconnect contacts comprising indentations and conductive layers configured to electrically engage the component contacts;
    a force applying mechanism on the base configured to bias the component against the interconnect; and
    at least one support member on the interconnect, separate from the interconnect contacts configured to physically contact the surface of the component to support and prevent flexure of the component as the force applying mechanism biases the component against the interconnect and the interconnect contacts electrically engage the component contacts.

2. The test carrier of claim 1 wherein the interconnect comprises a substrate and the at least one support member comprises a raised member on the substrate having a planar surface for engaging the surface of the component.

3. The test carrier of claim 1 wherein the interconnect comprises a substrate and the at least one support member comprises a raised member on the substrate comprising an elastomeric layer configured to compress to accommodate dimensional variations in the component contacts.

4. The test carrier of claim 1 wherein the surface comprises a pad and the at least one support member is configured to engage the pad.

5. The test carrier of claim 1 wherein the component contacts comprise bumps.

6. A test carrier for testing a semiconductor component having a surface, a plurality of pads on the surface and a plurality of component contacts on the surface comprising:
    a base;
    an interconnect on the base comprising a substrate, a plurality of interconnect contacts on the substrate comprising a plurality of conductive layers configured to electrically engage the component contacts, and a plurality of support members on the substrate separate from the interconnect contacts configured to physically contact the pads; and
    a force applying mechanism on the base configured to bias the component against the interconnect as the interconnect contacts electrically engage the component contacts and the support members physically contact the pads to support and prevent flexure of the component.

7. The test carrier of claim 6 wherein the substrate comprises silicon and each support member comprises a silicon pillar having a planar surface.

8. The test carrier of claim 6 wherein each support member comprises a pillar at least partially covered with an elastomeric layer configured to compress to accommodate dimensional variations in the component contacts.

9. The test carrier of claim 6 wherein each interconnect contact comprises a raised member at least partially covered with a conductive layer.

10. The test carrier of claim 6 wherein the interconnect contacts comprise indentations at least partially covered with the conductive layers.

11. The test carrier of claim 6 wherein the support members have a first height H1 and the interconnect contacts have a second height H2 which is from one to several microns greater than H1.

12. A test carrier for testing a semiconductor component having a surface and a plurality of component contacts on the surface comprising:
   a base comprising a plurality of terminal contacts;
   an interconnect on the base comprising a plurality of interconnect contacts comprising a plurality of conductive layers in electrical communication with the terminal contacts and configured to electrically engage the component contacts, and at least one raised support member separate from the interconnect contacts comprising an elastomeric layer configured to physically contact the surface of the component and to compress to accommodate dimensional variations in the component contacts; and
   a force applying mechanism on the base configured to bias the component against the interconnect as the interconnect contacts electrically engage the component contacts, the at least one raised support member physically contacts the surface to support and prevent flexure of the component, and the elastomeric layer compresses to accommodate the dimensional variations.

13. The test carrier of claim 12 wherein the component comprises a chip scale package and the component contacts comprise solder balls.

14. The test carrier of claim 12 wherein the interconnect and the at least one raised support member comprise silicon.

15. The test carrier of claim 12 wherein the interconnect comprises a plurality of raised support members configured to engage the surface of the component proximate to edge portions thereof.

16. The test carrier of claim 12 wherein the interconnect comprises a plurality of raised support members configured to engage the surface proximate to a periphery of the component.

17. A test carrier for testing a semiconductor component having a surface and a plurality of component contacts on the surface comprising:
   a base;
   an interconnect on the base comprising a substrate, a plurality of interconnect contacts on the substrate configured to electrically engage the component contacts comprising indentations in the substrate and conductive layers on the indentations, at least one support member on the substrate separate from the interconnect contacts configured to physically engage the surface of the component, and a plurality of conductive vias through the substrate in electrical communication with the interconnect contacts;
   a force applying mechanism on the base configured to bias the component against the interconnect as the at least one support member physically engages the surface to support and prevent flexure of the component; and
   a plurality of terminal contacts on the interconnect in electrical communication with the conductive vias.

18. The test carrier of claim 17 wherein the surface comprises a pad and the at least one support member physically engages the pad.

19. The test carrier of claim 17 wherein the base comprises plastic molded to the interconnect.

20. The test carrier of claim 17 wherein the base comprises ceramic laminated to the interconnect.

* * * * *